(12) United States Patent
Weed

(10) Patent No.: US 9,939,084 B2
(45) Date of Patent: Apr. 10, 2018

(54) REMOVABLE ISOLATION VALVE SHIELD INSERT ASSEMBLY

(71) Applicant: Applied Materials, Inc., Santa Clara, CA (US)

(72) Inventor: Brian Weed, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/052,519

(22) Filed: Feb. 24, 2016

(65) Prior Publication Data

US 2016/0169412 A1 Jun. 16, 2016

Related U.S. Application Data

(62) Division of application No. 14/496,566, filed on Sep. 25, 2014, now Pat. No. 9,291,275.

(60) Provisional application No. 61/884,091, filed on Sep. 29, 2013.

(51) Int. Cl.
| | |
|---|---|
| *F16K 51/02* | (2006.01) |
| *F16K 1/42* | (2006.01) |
| *F16K 3/02* | (2006.01) |
| *F16K 27/04* | (2006.01) |
| *H01L 21/67* | (2006.01) |

(52) U.S. Cl.
CPC ............ *F16K 51/02* (2013.01); *F16K 1/42* (2013.01); *F16K 3/0209* (2013.01); *F16K 27/044* (2013.01); *H01L 21/67126* (2013.01); *Y10T 137/7062* (2015.04)

(58) Field of Classification Search
CPC .......... F16K 51/02; F16K 1/42; F16K 3/0209; F16K 27/044; H01L 21/67126; Y10T 137/7062

USPC ............... 251/326–329, 360–363, 368, 120; 138/44, 94.3; 137/382

See application file for complete search history.

(56) References Cited

U.S. PATENT DOCUMENTS 2,198,860 A * 4/1940 Carlson .................... B41J 5/38
251/901
3,284,046 A * 11/1966 Allenbaugh, Jr. .... F16K 5/0684
251/315.08

(Continued)

FOREIGN PATENT DOCUMENTS

| EP | 1731806 A1 | 12/2006 |
|---|---|---|
| JP | 2008538227 A | 10/2008 |

(Continued)

OTHER PUBLICATIONS

PCT international search report and written opinion of PCT/US2014/057453 dated Jan. 16, 2015.

(Continued)

*Primary Examiner* — John Bastianelli
(74) *Attorney, Agent, or Firm* — Patterson + Sheridan, LLP

(57) ABSTRACT

An isolation valve is provided, along with removable shield insert assemblies for an isolation valve. In one embodiment, a shield insert assembly for an isolation valve is provided that includes a graphite first shield insert having a flat ring shape. The first shield insert has a circular outer diameter. An elongated aperture is formed through the first shield insert. At least two fastener holes are formed through the first shield insert configured to couple the first shield insert to a first shield support.

20 Claims, 5 Drawing Sheets

(56) References Cited

U.S. PATENT DOCUMENTS

| | | | | |
|---|---|---|---|---|
| 3,379,408 A * | 4/1968 | Lowrey | F16K 5/0684 |
| | | | 251/298 |
| 3,443,789 A | 5/1969 | Bucklin | |
| 3,743,238 A * | 7/1973 | Watts | F16K 3/029 |
| | | | 137/1 |
| 4,377,274 A | 3/1983 | Mayhew, Jr. | |
| 4,489,756 A * | 12/1984 | Balz | F16K 3/0263 |
| | | | 137/625.33 |
| 4,570,670 A | 2/1986 | Johnson | |
| 4,634,098 A * | 1/1987 | Varden | F16K 1/24 |
| | | | 137/559 |
| 4,635,674 A * | 1/1987 | Bajka | E04H 4/1209 |
| | | | 137/246.22 |
| 4,643,226 A * | 2/1987 | Balz | F16K 27/044 |
| | | | 137/625.33 |
| 5,069,252 A * | 12/1991 | Kendrick | G01F 1/42 |
| | | | 138/40 |
| 5,143,348 A | 9/1992 | Baker et al. | |
| 5,305,796 A * | 4/1994 | Klak | G01F 1/42 |
| | | | 138/40 |
| 5,318,073 A * | 6/1994 | Kendrick | F15D 1/0005 |
| | | | 138/44 |
| 5,377,955 A | 1/1995 | Baker | |
| 5,549,276 A * | 8/1996 | Pittman | F16K 41/02 |
| | | | 251/214 |
| 5,839,399 A * | 11/1998 | Luce | F01L 7/028 |
| | | | 123/190.4 |
| 6,423,965 B1 | 7/2002 | Hashimoto et al. | |
| 6,448,567 B1 | 9/2002 | Botelho et al. | |
| 7,481,239 B2 | 1/2009 | McGuire et al. | |
| 2004/0026467 A1* | 2/2004 | Plattner | B22D 41/40 |
| | | | 222/600 |
| 2006/0091347 A1 | 5/2006 | McGuire et al. | |
| 2006/0185599 A1 | 8/2006 | Bichrt | |
| 2006/0278164 A1 | 12/2006 | Petrach et al. | |
| 2007/0000608 A1 | 1/2007 | Lee et al. | |
| 2007/0235679 A1* | 10/2007 | Sutliff | F16K 1/2007 |
| | | | 251/317.01 |
| 2009/0218536 A1* | 9/2009 | Wears | F16K 11/044 |
| | | | 251/319 |
| 2011/0272617 A1 | 11/2011 | Lah | |

FOREIGN PATENT DOCUMENTS

| | | |
|---|---|---|
| TW | 493051 B | 7/2002 |
| TW | I289875 B | 11/2007 |

OTHER PUBLICATIONS

Office Action from Taiwan Patent Application No. 103133609 dated Aug. 23, 2016 and English translation to provide a concise statement of relevance for the foreign citations.

* cited by examiner

REMOVABLE ISOLATION VALVE SHIELD INSERT ASSEMBLY

CROSS REFERENCE TO RELATED APPLICATION

This application is a divisional application of U.S. patent application Ser. No. 14/496,566, filed Sep. 25, 2014, which claims benefit of U.S. Provisional Patent Application Ser. No. 61/884,091, filed Sep. 29, 2013, both of which are incorporated by reference in their entirety.

FIELD

Embodiments described herein relate to semiconductor manufacturing apparatus and methods. Specifically, embodiments described herein relate isolation valves for processing chambers, and more specifically, to removable shield inserts for an isolation valve.

BACKGROUND

In many conventional processing chambers, areas between the backside of an isolation valve and the source chamber exit are not accessible without removing the valve. Processing substrates may coat this area leading to contamination and equipment malfunctions. However, cleaning and servicing this area is very difficult due to poor access. Thus, considerable maintenance time disassembling valves is required to service and clean the valve components.

Therefore there is a need for an improved isolation valve.

SUMMARY

An improved isolation valve is provided, along with removable shield insert assemblies for an isolation valve. In one embodiment, a shield insert assembly for an isolation valve is provided that includes An improved isolation valve is provided, along with removable shield insert assemblies for an isolation valve. In one embodiment, a shield insert assembly for an isolation valve is provided that includes a graphite first shield insert having a flat ring shape. The first shield insert has a circular outer diameter. An elongated aperture is formed through the first shield insert. At least two fastener holes are formed through the first shield insert configured to couple the first shield insert to a first shield support.

In another embodiment, an isolation valve is provided. The isolation valve includes a valve housing, a first shield insert assembly coupled to a first side of the housing, a second shield insert assembly coupled to a second side of the housing, and a closure member disposed in the housing. The valve housing has an aperture. The first shield insert assembly has a first shield support coupled to the housing and a first shield insert removably coupled to an aperture of the first shield support. The first shield insert has an elongated aperture. The second shield insert assembly is coupled to a second side of the housing. The second shield insert assembly has a second shield support coupled to the housing and a second shield insert removably coupled to an aperture of the second shield support. The second shield insert has an elongated aperture aligning with the elongated aperture of the first shield insert. The closure member is movable between positions closing and clear of the elongated apertures. The second shield insert is sized to fit through the aperture of the first shield support.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In a continuous quest to reduce semiconductor production costs and improve tool performance, fabrication facility managers frequently seek ways to cut the cost of production tool consumables and components. But there are pitfalls.

A strategy focused on cost alone may not consider the differing priorities of many internal design and manufacturing stakeholders: the design team wants the highest-possible tool performance to reduce defects, while the manufacturing group's imperative is to operate tools at the lowest possible cost in reliable, high-volume production, and the purchasing team wants to lowest possible price.

In some cases, the tool original equipment manufacturers (OEM) can offer alternatives, including cleaning or repair solutions that are cost-effective and help improve performance. Other times, the best course of action is to redesign the consumable or component to improve the productivity and performance of the tool in a specific application, thereby increasing yield while reducing the tool's total cost of ownership. But the success of such efforts relies on the depth of equipment knowledge of the company redesigning the part.

An application-specific consumable and component that can reduce overall tool operational costs by meeting the manufacturer's specific requirements more effectively is provided herein. More specifically, an insert shield suitable for use in existing isolation valves, for example those used on ion implanters manufactured by Varian Semiconductor Equipment and others, is described herein. The insert shield assembly may also be configured for use on isolation valves provided by manufactures. The insert shield assembly is also suitable for other types of isolation valves. Flakes that build up on the valve shields and can cause process issues if not cleaned. Cleaning of the existing conventional shields required removal of the isolation valve and a long preventive maintenance (PM) routine. The isolation valve insert shield assemblies of the present disclosure can be removed without removing the isolation valve. This has contributed to better process performance with dramatically decreased PM time.

Figure 1:
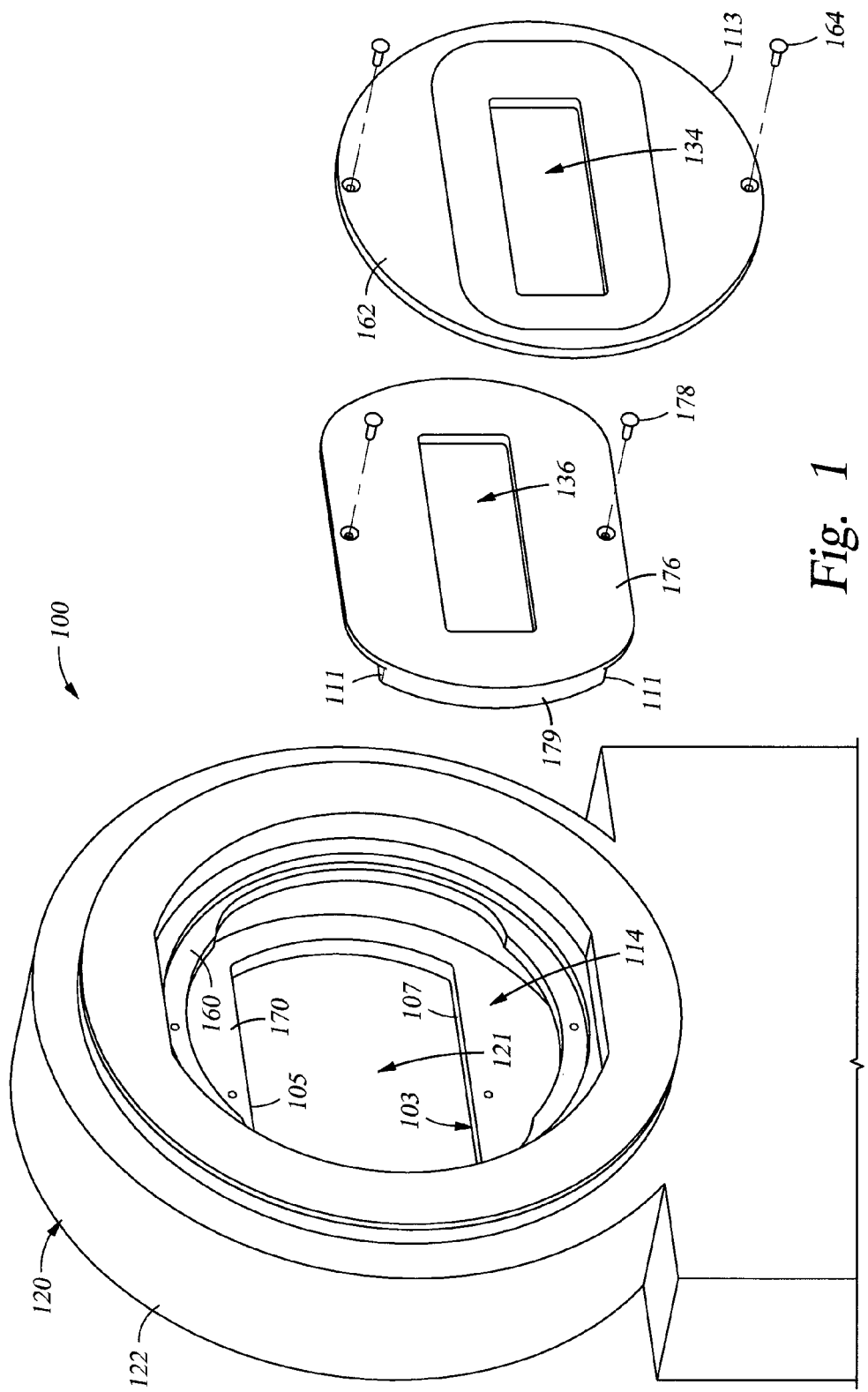
FIG. 1 illustrates an exploded orthogonal view of an isolation valve having removable inserts used to protect a valve shield.
Figure 2A:
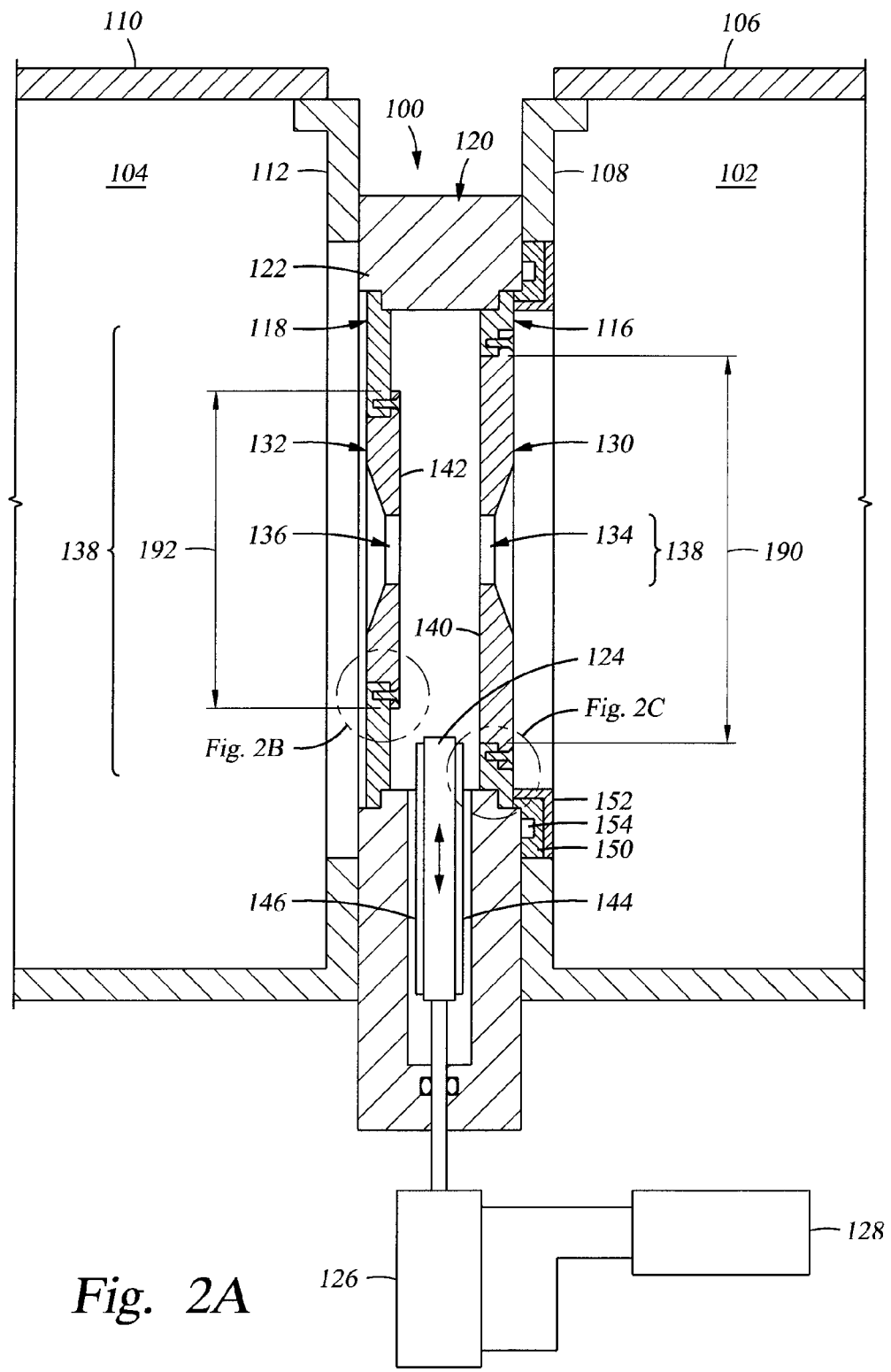
FIGS. 2A-2C are sectional and enlarged sectional views of the isolation valve positioned between two chambers.
Figure 2B:
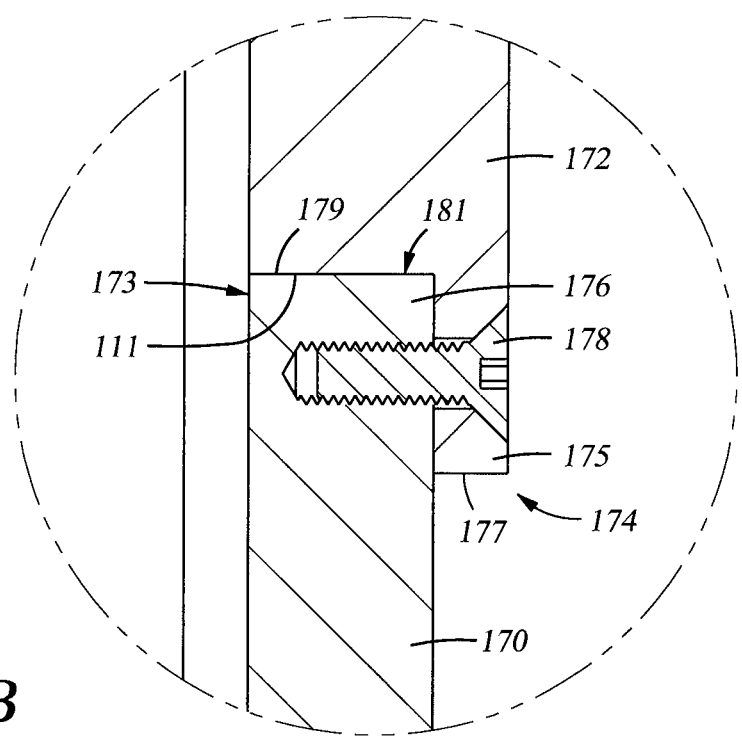
Figure 2C:
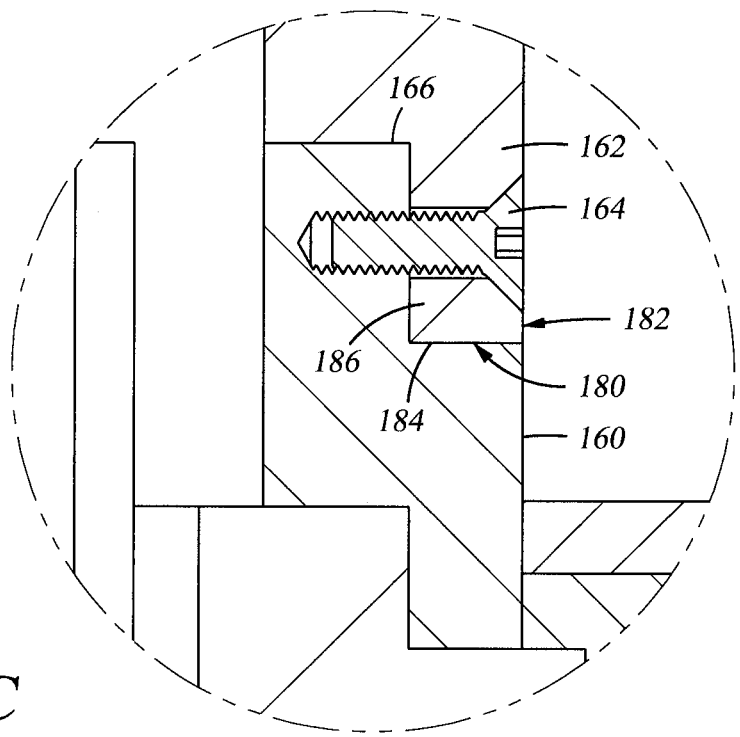

FIGS. 1 and 2 illustrates an exploded orthogonal and sectional views of an isolation valve 100 having removable shield insert assemblies 130, 132. The removable shield insert assemblies 130, 132 are used to protect a closure member 124 of the isolation valve 100 and eliminate the need for costly, time-consuming removal and cleaning of the isolation valve 100.

The isolation valve 100 includes a body assembly 120 which is mounted between a first chamber 102 and a second chamber 104. In embodiments wherein the isolation valve 100 may be utilized in an ion implantation system, the first chamber 102 may be a beam generator and the second chamber 104 may be a resolving chamber. In other applications, the isolation valve 100 may be adapted to be utilized between chambers 102, 104 configured for other types of semiconductor processing.

The body assembly 120 includes a housing 122 having an aperture 114 providing a connection between the chambers 102, 104. The closure member 124 is disposed in the housing 122 and is coupled to an actuator 126. The actuator 126 is utilized to move the closure member 124 to open and close a tunnel 138 between the chambers 102, 104 through the isolation valve 100. The actuator 126 is coupled to a controller 128 to control the operation of the actuator 126, and thus the position of the closure member 124 within the housing 122.

The removable shield insert assemblies 130, 132 are coupled to opposite sides of the housing 122 over the aperture 114. The first shield insert assembly 130 includes a first shield support 160 and a first shield insert 162. In one example, a thickness of the first shield support 160 is about equal to a thickness of the first shield insert 162, such that both sides of the first shield support 160 and the first shield insert 162 align when assembled.

The first shield support 160 is coupled to a first side 116 of the housing 122, for example utilizing fasteners (not shown). The first shield support 160 has a generally flat ring shape. The first shield support 160 has an inner wall 166 that defines an aperture 190 formed through the first shield support 160. The first shield insert 162 is coupled over the aperture 190 of the first shield support 160. The first shield insert 162 includes an aperture 134 formed therethrough, which, being within the aperture 190 of the first shield support 160, provides a passage through the first shield insert assembly 130.

The first shield support 160 engages the first shield insert 162 in a manner that allows the first shield insert 162 to be removed from the first shield support 160 without removing the first shield support 160 from the housing 122. In one example, the first shield support 160 may include a mating feature 180 that engages a complimentary mating feature 182 of the first shield insert 162. The mating feature 180 of the first shield support 160 may be a notch 184 formed in the side of the first shield support 160 facing away from the second shield insert assembly 132 (i.e., towards the first chamber 102). The mating feature 180 and complimentary mating feature 182 may be configured to orientate the first shield support 160 and the first shield insert 162 in a predefined orientation. Alternatively, locating pins may be utilized to secure the first shield support 160 and the first shield insert 162 in a predefined orientation. The complimentary mating feature 182 of the first shield insert 162 may be lip 186 that defines the outer extents of the first shield insert 162. The lip 186 may have a circular outer diameter 113. The lip 186 may engage the notch 184 to position the first shield support 160 relative to the first shield insert 162, and in one example, forms a lap joint between the first shield support 160 and the first shield insert 162.

A fastener 164 may be utilized to secure the first shield support 160 to the first shield insert 162. The fastener 164 is accessible from the first side 116 of the housing 122 so that the first shield insert 162 may be removed from the first shield support 160 by accessing the first shield insert assembly 130 from the interior of the first chamber 102, for example, through a lid 106 of the first chamber 102. For example, the fastener 164 is may be extended through a through fastener hole formed in the first shield insert 162 and engaged with a threaded fastener hole formed the first shield support 160 so that the fasteners 164 may be removed from the first side 116 of the housing 122.

A seal ring 150 may be utilized to cover the interface between the housing 122 and first shield support 160. The seal ring 150 may be fabricated from aluminum or other suitable material. A seal 154 is disposed between the seal ring 150 and housing 122 to prevent leakage therebetween. A seal ring cover 152 may be disposed over the seal ring 150 to protect the seal ring 150 form potential damage, for example, from ions traveling in the first chamber 102 towards the isolation valve 100. The seal ring cover 152 may be fabricated from graphite or other suitable material.

The second shield insert assembly 132 includes a second shield support 170 and a second shield insert 172. In one example, a thickness of the second shield support 170 is less than a thickness of the second shield insert 172.

The second shield support 170 generally has a flat ring shape. The second shield support 170 engages the second shield insert 172 in a manner that allows the second shield insert 172 to be removed from the second shield support 170 without removing the second shield support 170 from the housing 122. The interface between the second shield support 170 and the second shield insert 172 is also configured to allow the second shield insert 172 to be removed from the second shield support 170 from the first side 116 of the housing 122 after the first shield insert 162 has been removed and without removing the first shield support 160. In one example, the second shield support 170 may include a mating feature 173 that engages a complimentary mating feature 174 of the second shield insert 172. The mating feature 173 of the second shield support 170 may be a lip 176 defined by the aperture 136 of the second shield support 170. The mating feature 173 and complimentary mating feature 174 may be configured to orientate the second shield support 170 and the second shield insert 172 in a predefined orientation. Alternatively, locating pins may be utilized to secure the second shield support 170 and the second shield insert 172 in a predefined orientation. The complimentary mating feature 174 of the second shield insert 172 may be a lip 175 extending from an outer edge 179 of the second shield insert 172. The outer edge of the lip 175 defines an outer wall 177 of the second shield insert 172. The lip 175 and outer edge 179 of the second shield insert 172 form a notch 181 that receives the lip 176. The outer wall 177 may have a substantially oval outer extent. The outer wall 177 may include flats 103 on opposite sides of the second shield insert 172. The lip 175 may engage the notch 181 to position the second shield support 170 relative to the second shield insert 172. In one example, the lip 175 of the second shield insert 172 may overlap the second shield support 170.

An aperture 121 of the second shield support 170 is defined by an inner wall 107. The inner wall 107 may include one or more flats 103, 105. In the embodiment of FIGS. 1 and 2, the flats 103, 105 are disposed in parallel on opposite sides of the aperture 121. The flats 103, 105 are configured to engage with corresponding parallel flats 111 formed on the outer edge 179, which retain the second shield support 170 and the second shield insert 172 in a predefined orientation.

A fastener 178 may be utilized to secure the second shield support 170 to the second shield insert 172. The fastener 178 is accessible from the first side 116 of the housing 122, for example after the first shield insert 162 of the first shield insert assembly 130 has been removed from the housing 122, so that the second shield insert 172 may be removed from the second shield support 170 by accessing the second shield insert 172 from the interior of the first chamber 102, for example, through the lid 106 of the first chamber 102. For example, the fastener 178 is may be extended through a through fastener hole formed in the second shield insert 172 and engaged with a threaded fastener hole formed the second shield support 170 so that the fasteners 178 may be access through the aperture 190 formed in the first shield support 160 and removed from the first side 116 of the housing 122.

The second shield insert 172 is sized to allow the removal of the second shield insert 172 through the aperture 190 defined by the inner wall 166 of the first shield support 160. In one example, a height 192 defined by the outer wall 177 of the second shield insert 172 is less than a height of the aperture 190.

The second shield insert 172 also includes an aperture 136 which aligns with the aperture 134 formed in the first shield insert 162. The apertures 134, 136 align to form the tunnel 138 through the isolation valve 100. The tunnel 138 is open to allow passage between the chambers 102, 104 through the valve assembly 100 when the closure member 124 is displaced by the actuator 126 to a position clear of the apertures 134, 136. Conversely, the closure member 124 may be displaced by the actuator 126 to a position to close the tunnel 138.

In one example, the closure member 124 is simply utilized to prevent line-of-sight passage of ions beams through the isolation valve 100, and thus, vacuum sealing is not required. In such embodiments, an open area of the aperture 134 may be less than an open area of the aperture 136, thereby reducing the probability of ion strikes to the side of the second shield insert 172 facing the first shield insert assembly 130 and first chamber 102.

In another example, the closure member 124 may include one or more sealing surfaces 144, 146 that may be placed in contact with the shield inserts 162, 172 to provide a vacuum seal. For example, the closure member 124 may be configured to expand with the closure member 124 is aligned with the tunnel 138, thus, urging the sealing surfaces 144, 146 of the closure member 124 against interior surfaces 140, 142 of the shield inserts 162, 172.

The shield inserts 162, 172 may be formed from a carbon-based material, such as graphite, or other suitable material. Similarly, the shield supports 160, 170 may be formed from carbon-based material, such as graphite, or other suitable material, for example, aluminum.

Figure 3:
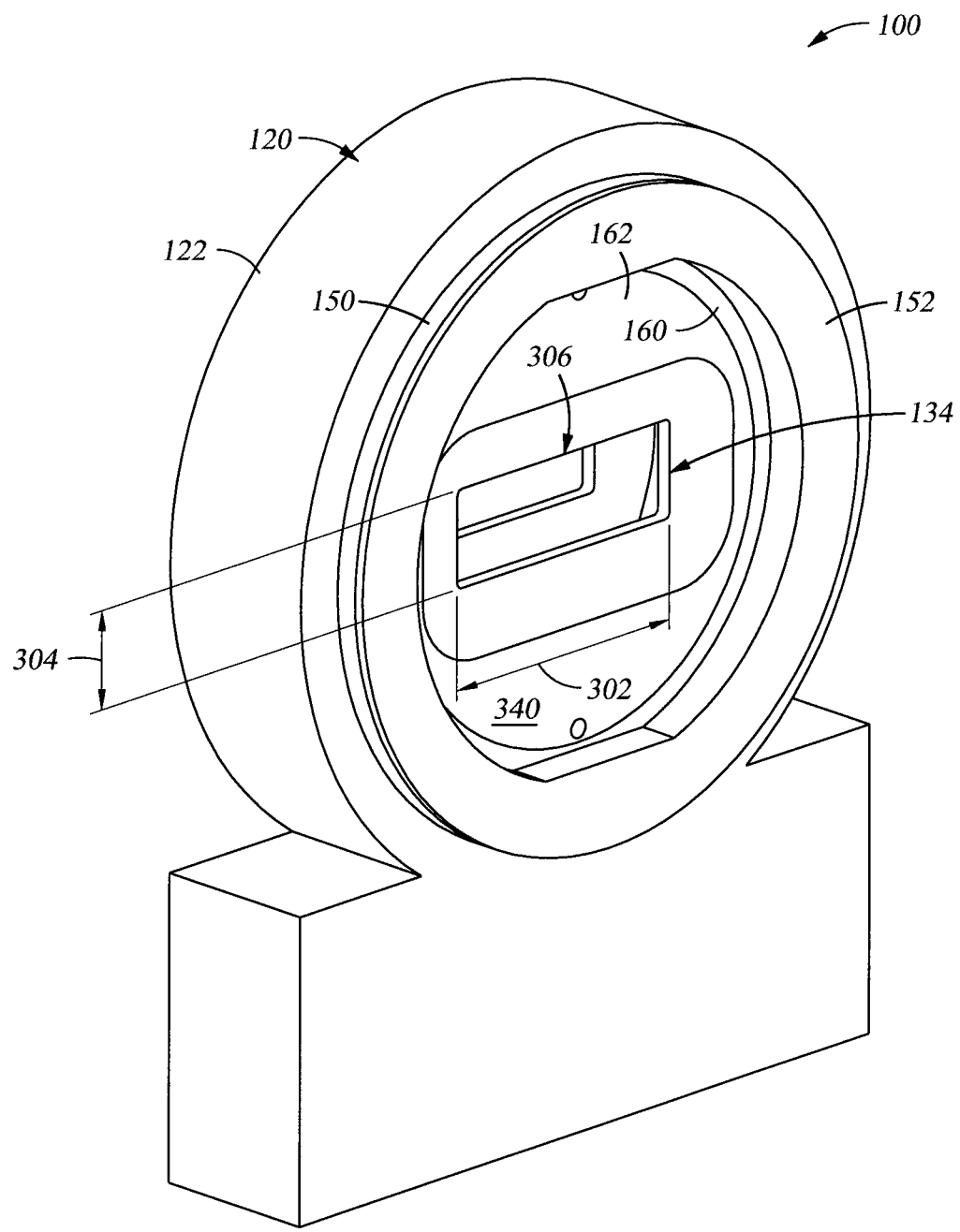
FIG. 3 is a front orthogonal view of the isolation valve with the removable inserts secured to the isolation valve.
Figure 4:
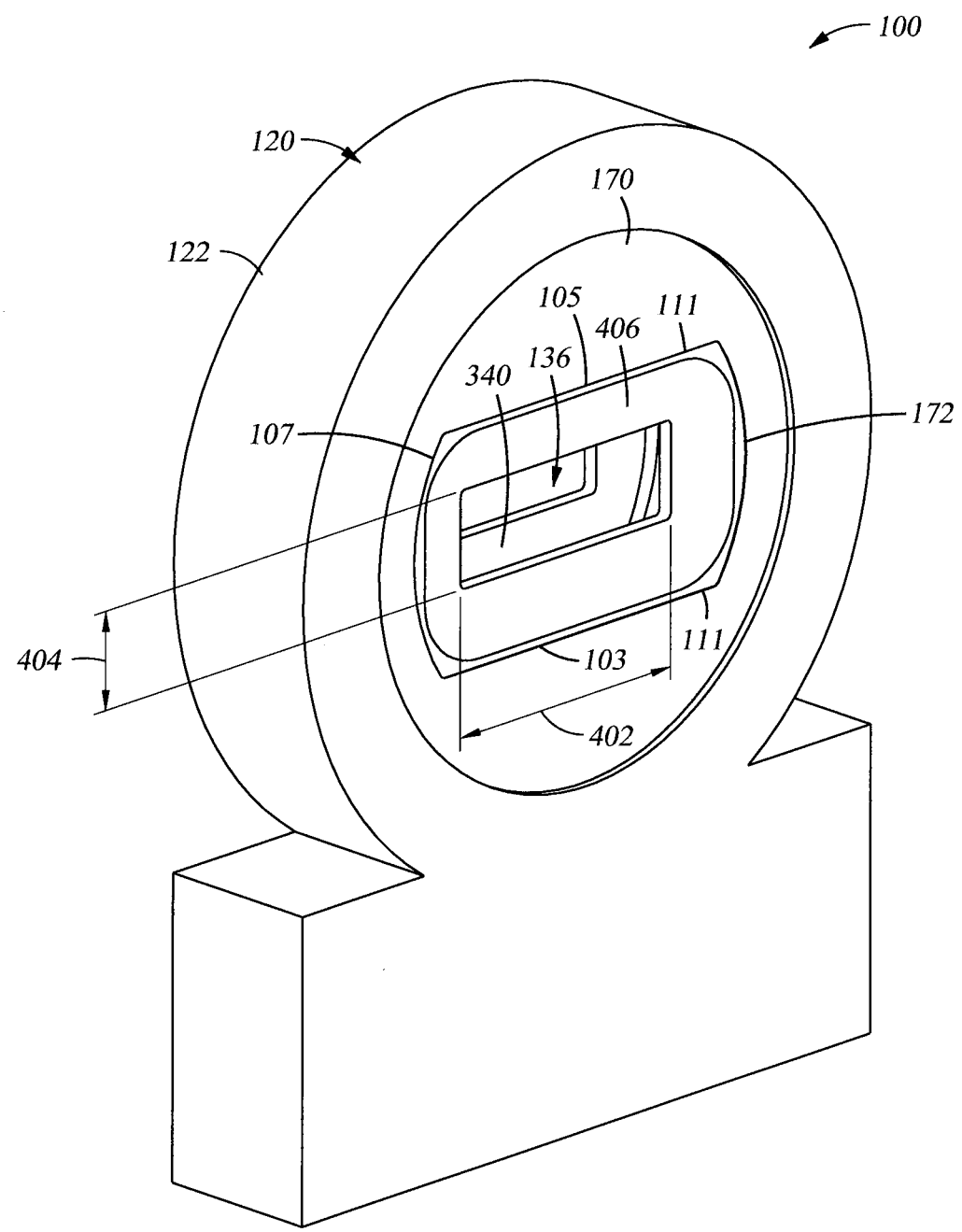
FIG. 4 is a back orthogonal view of the isolation valve with the removable inserts secured to the isolation valve.

FIGS. 3 and 4 are front and back orthogonal views of the isolation valve 100 illustrating exterior surfaces 340, 342 of the removable shield inserts 162, 172 coupled to the housing 122. The exterior surfaces 340, 342 are respectively disposed on the opposite the interior surfaces 140, 142 (illustrated in FIGS. 2A-C) of the shield inserts 162, 172, and thus face towards the chambers 102, 104. As discussed above, the first shield insert 162 of the shield insert assembly 130 has the aperture 134 formed therethrough. The aperture 134 has a generally elongated rectangular shape. For example aperture 134 may have a width 302 that is substantially, for example at least 4 times, greater than a height 304. In another example, the width 302 may be sized similarly to a substrate disposed in the second chamber 104. For example, the width 302 may be at least 200 mm, at least 300 mm, at least 450 mm or have another width.

As shown in FIG. 3, the thickness of the first shield insert 162 is tapered on the exterior side 340 of the first shield insert 162. For example, a taper 306 may completely circumscribe the aperture 134, such that the thickness of the first shield insert 162 become thinner near the aperture 134.

Similarly, the second shield insert 172 of the second shield insert assembly 132 has the aperture 136 formed therethrough. The aperture 136 also has a generally elongated rectangular shape. For example aperture 136 may have a width 402 that is substantially, for example at least 4 times, greater than a height 404. In another example, the width 402 may be sized similarly to a substrate disposed in the second chamber 104. For example, the width 402 may be at least 200 mm, at least 300 mm, at least 450 mm or have another width. In one example, the width 402 is substantially the same as (i.e., equal to) the width 302 of the first shield insert 162.

The height 404 of the aperture 136 may be the same or greater than the height 304 of the aperture 134. The smaller height 304 assists in reducing the amount of beam strikes on the interior surface 142 of the second shield insert 172, which assists extending the service interval of the second shield insert 172.

As shown in FIG. 4, the thickness of the second shield insert 172 is tapered on the exterior side 342 of the second shield insert 172. For example, a taper 406 may completely circumscribe the aperture 136.

The shield inserts 162, 172 may be oriented, when fastened to the shield supports 160, 170, such that the widths 302, 402 are aligned in the same direction. In one example, the width 302 may be slightly smaller than the width 402. The smaller width 302 assists reducing the beam strikes to the interior side 142 of the second shield insert 172.

Similarly, the heights 304, 404 of the shield inserts 162, 172 may also be aligned in the same direction. In some embodiments, the height 304 of the first shield insert 162 may be smaller than the height 404 of the shield insert 172. This configuration assists protecting the shield insert 172 from beam strikes, which increases the service interval of the shield insert assemblies 130, 132.

The invention has been described above with reference to specific embodiments and numerous specific details are set forth to provide a more thorough understanding of the invention. Persons skilled in the art, however, will understand that various modifications and changes may be made thereto without departing from the broader spirit and scope of the invention. The foregoing description and drawings are, accordingly, to be regarded in an illustrative rather than a restrictive sense.

What is claimed is:

1. A shield insert assembly for an isolation valve comprising:
   a graphite first shield insert having a flat ring shape, the first shield insert comprising:
   a circular outer diameter;
   an elongated aperture formed through the first shield insert; and
   at least two fastener holes are formed through the first shield insert configured to couple the first shield insert to a first shield support.

2. The shield insert assembly of claim 1 comprising:
a first shield support having a notch configured to mate with the circular outer diameter of the first shield insert.

3. The shield insert assembly of claim 2, wherein the first shield support is fabricated from graphite or aluminum.

4. The shield insert assembly of claim 2, wherein the notch of the first shield support forms a lap joint with the first shield insert.

5. The shield insert assembly of claim 2, wherein a thickness of the first shield support is about equal to a thickness of the first shield insert.

6. The shield insert assembly of claim 1 further comprising:
a first shield support having an aperture configured to receive and mate with the circular outer diameter of the first shield insert;
a second shield insert having an elongated aperture; and
a second shield support having an aperture configured to mate with the second shield insert, the second shield insert sized to fit through the aperture of the first shield support.

7. The shield insert assembly of claim 6, wherein the second shield insert is fabricated from graphite.

8. The shield insert assembly of claim 6, wherein the second shield insert is oval shaped.

9. The shield insert assembly of claim 6, wherein the second shield insert further comprises:
a thickness tapering to the elongated aperture of the second shield insert.

10. The shield insert assembly of claim 6, wherein the second shield insert further comprises:
an outer wall larger than the aperture of the second shield support.

11. An ion implantation system comprising:
an implantation chamber;
a body assembly mounted to a side of the implantation chamber, wherein the body assembly comprises:
a housing having an aperture providing a connection to the implantation chamber;
a closure member disposed in the housing;
an actuator coupled to the closure member, the actuator operable to move the closure member to open and close the aperture; and
the shield assembly of claim 1 coupled to the housing over the aperture.

12. The shield insert assembly of claim 1, further comprising:
a first dimension corresponding to a height of the elongated aperture formed through the first shield insert; and
a second dimension corresponding to a width of the elongated aperture formed in the first shield insert, wherein the second dimension is at least about four times greater than the first dimension.

13. The shield insert assembly of claim 1, wherein along a radius of the first shield insert, a first distance of the aperture to the circular outer diameter in a direction of the first dimension is smaller than a second distance of the aperture to the circular outer diameter in a direction of the second dimension.

14. The shield insert assembly of claim 1, wherein the graphite first shield insert further comprises:
a first side, and
a second side wherein a surface area of the second side is larger than a surface area of the first side.

15. The shield insert assembly of claim 14, wherein the at least two fastener holes extend through the first side.

16. The shield insert assembly of claim 15, wherein the at least two fastener holes do not extend through the second side.

17. The shield insert assembly of claim 16, wherein the at least two fastener holes have a countersink on the first side.

18. The shield insert assembly of claim 17, wherein the second side is substantially planar.

19. The shield insert assembly of claim 14, further comprising:
a taper disposed on the first side completely circumscribing the aperture.

20. A shield insert assembly for an isolation valve comprising:
a graphite first shield insert having a flat shape, the first shield insert comprising:
an outer perimeter;
an elongated aperture formed through the first shield insert; and
at least two fastener holes are formed through the first shield insert configured to couple the first shield insert to a first shield support; and
a graphite second shield insert having a flat shape, the second shield insert comprising:
an outer perimeter; and
an elongated aperture, wherein the outer perimeter of the second shield insert is sized to fit through the elongated aperture formed in the first shield insert.

* * * * *